United States Patent
Ogawa et al.

(10) Patent No.: US 7,358,179 B2
(45) Date of Patent: Apr. 15, 2008

(54) METHOD OF MANUFACTURING SEMICONDUCTOR DEVICE INCLUDING AIR SPACE FORMED AROUND GATE ELECTRODE

(75) Inventors: Tetsuya Ogawa, Tokyo (JP); Toshiaki Kitano, Tokyo (JP); Hiroyuki Minami, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 146 days.

(21) Appl. No.: 11/295,663

(22) Filed: Dec. 7, 2005

(65) Prior Publication Data

US 2006/0199322 A1 Sep. 7, 2006

(30) Foreign Application Priority Data

Mar. 2, 2005 (JP) ............................. 2005-056898

(51) Int. Cl.
*H01L 21/4763* (2006.01)
*H01L 21/44* (2006.01)

(52) U.S. Cl. ..................... 438/619; 438/622; 438/595; 438/319; 438/411; 257/E23.013; 257/E23.143

(58) Field of Classification Search ................ 438/619, 438/595, 622, 319, 411, 421, 422; 216/15; 174/256; 257/522, E32.013, E23.143; 361/816, 361/820

See application file for complete search history.

(56) References Cited

U.S. PATENT DOCUMENTS

| 4,972,250 | A | * | 11/1990 | Omori et al. | ................ 257/631 |
| 5,536,971 | A |   | 7/1996 | Oishi et al. | |
| 6,798,064 | B1 | * | 9/2004 | Henry et al. | ................ 257/750 |
| 6,806,181 | B2 | * | 10/2004 | Sakamoto | ................ 438/619 |
| 2002/0140007 | A1 |   | 10/2002 | Sakamoto | |

FOREIGN PATENT DOCUMENTS

| JP | 6-140440 | 7/1996 |
| JP | 2001-118859 | 4/2001 |
| JP | 2002-299443 | 10/2002 |

OTHER PUBLICATIONS

Definition for the word "affix": Merriam-Webster online dictionary (2006-2007), www.merriam-webster.com.*

* cited by examiner

*Primary Examiner*—Hsien-Ming Lee
*Assistant Examiner*—Shaka Scarlett
(74) *Attorney, Agent, or Firm*—Leydig, Voit & Mayer, Ltd.

(57) ABSTRACT

After a HEMT is formed, side walls are formed on a semiconductor substrate. Next, a sacrificial layer is formed to cover the HEMT. Next, contact holes are formed in the sacrificial layer to expose upper surfaces of source electrodes. Next, a metal interconnect line is formed by patterning a metal film formed on the entire top surface. Next, slits are formed in the metal interconnect line to partially expose an upper surface of the sacrificial layer. After the sacrificial layer is dissolved, the dissolved sacrificial layer is discharged through the slits to the outside. An air space is formed as a result of the removal of the sacrificial layer.

8 Claims, 19 Drawing Sheets

F I G . 1
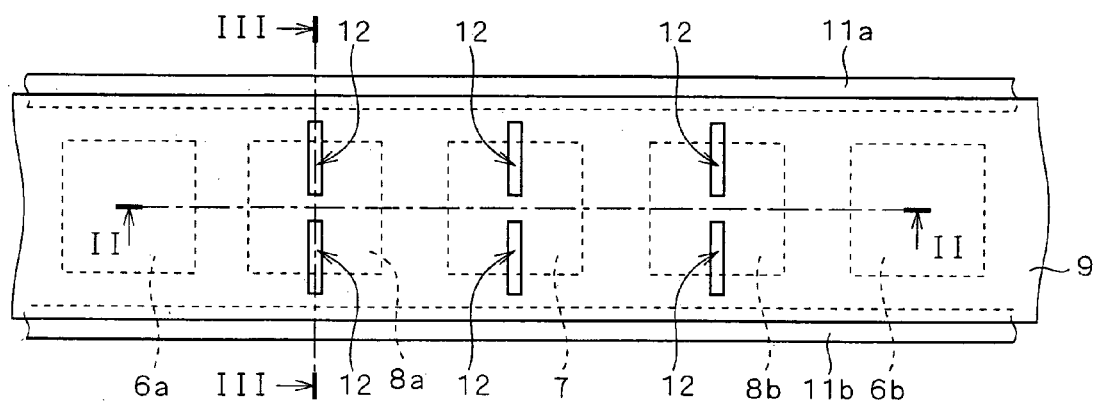
F I G . 2
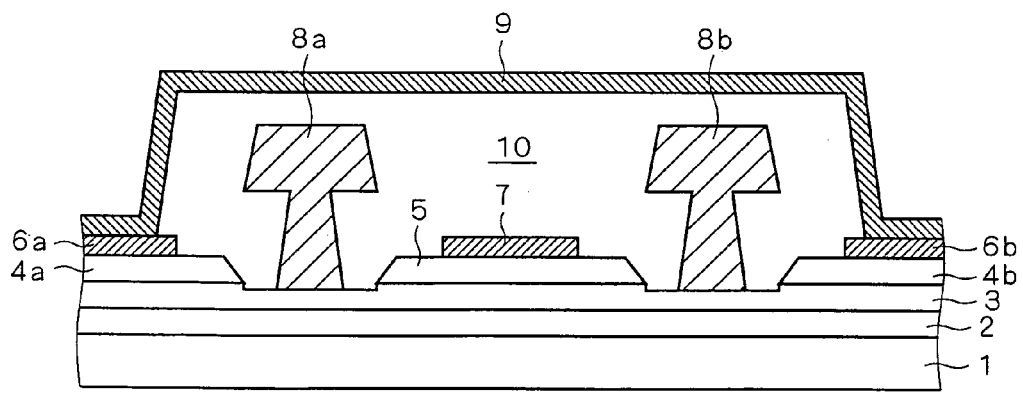

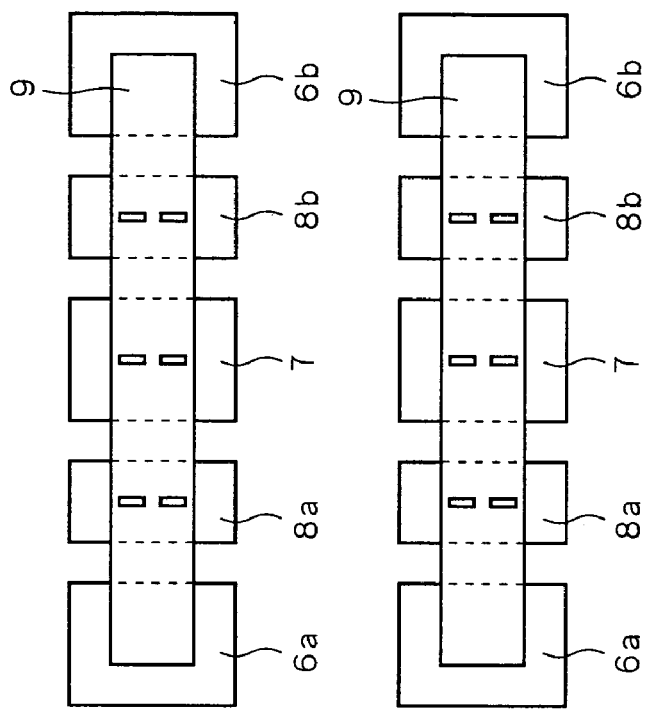
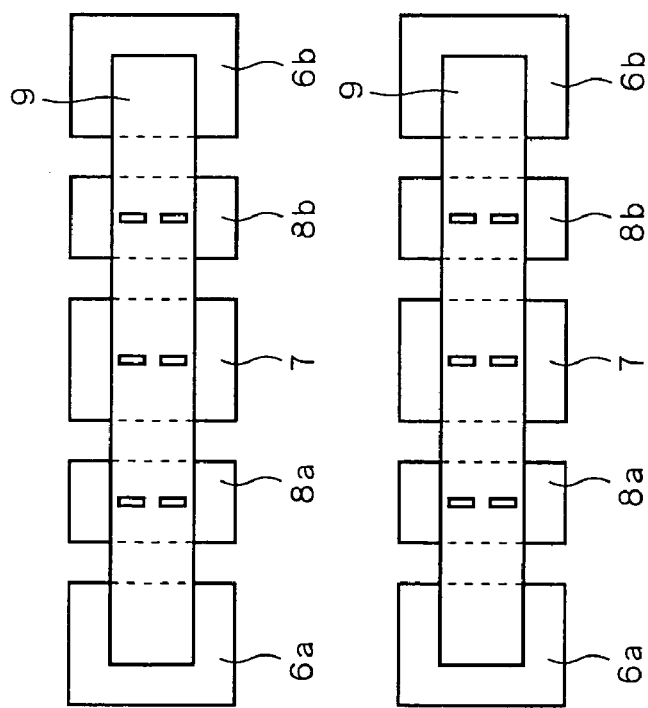
FIG. 23

F I G . 2 9
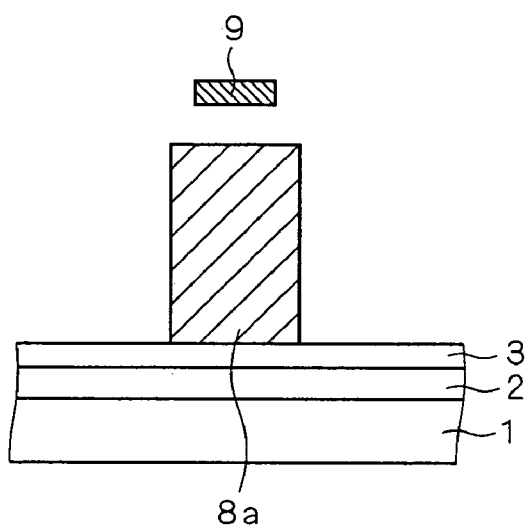
F I G . 3 0
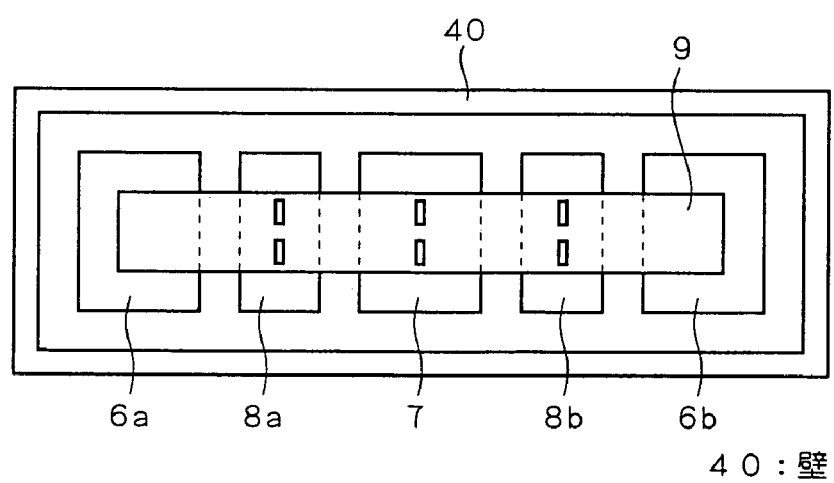
40：壁

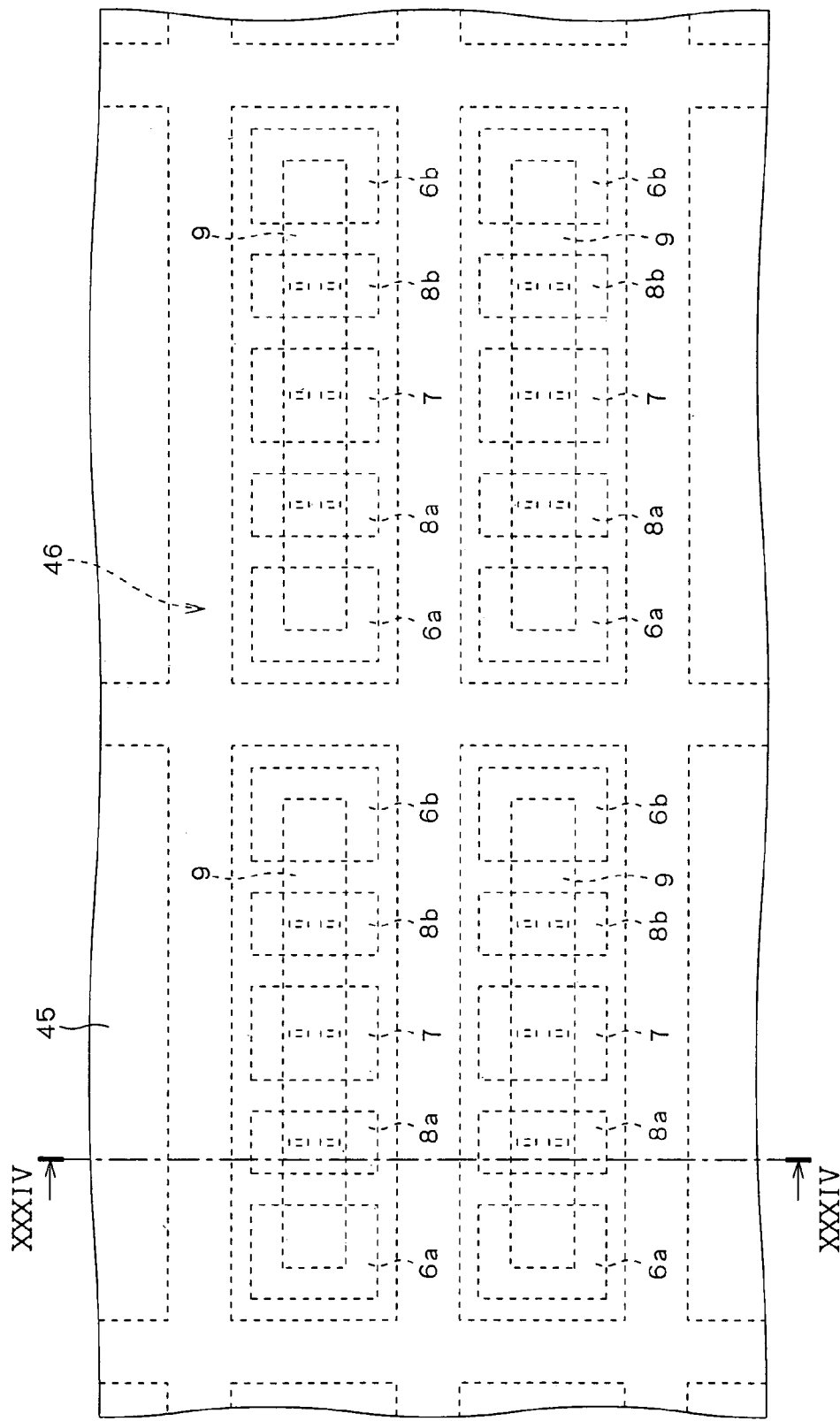

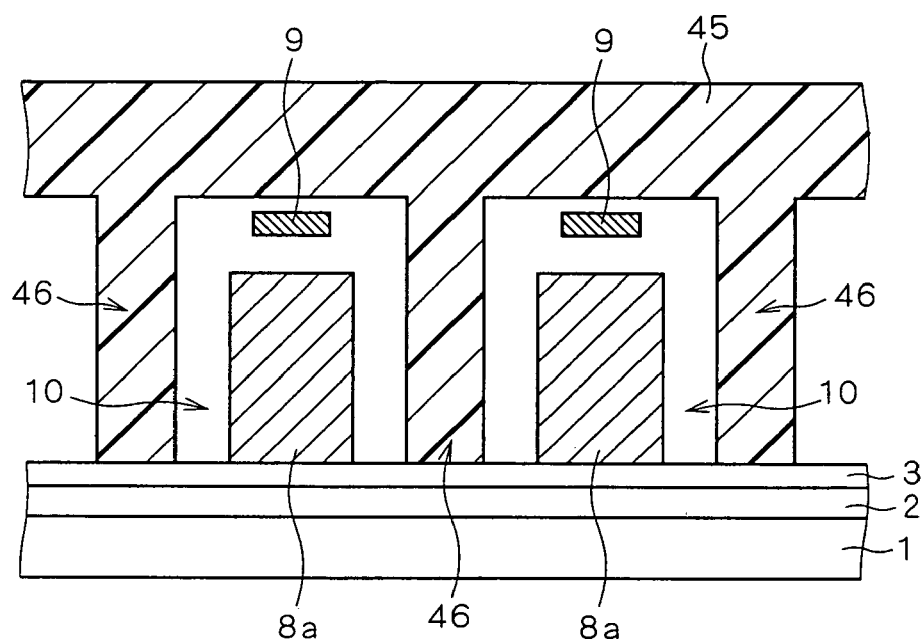
F I G . 3 4

METHOD OF MANUFACTURING SEMICONDUCTOR DEVICE INCLUDING AIR SPACE FORMED AROUND GATE ELECTRODE

BACKGROUND OF THE INVENTION

1. Field of the Invention

The present invention relates to a method of manufacturing a semiconductor device and, more particularly, to a method of manufacturing a transistor operating at high frequencies.

2. Description of the Background Art

In recent years, electronic circuits operating at high frequencies have been in dramatically increasing demand because of the worldwide expansion of the market for mobile communication equipment typified by portable telephones and the like and the rapid proliferation of satellite communication services. Additionally, with the increase in the amount of transmitted information, there has been a need for communication at higher frequencies. To meet such requirements, MMICs (Monolithic Microwave Integrated Circuits) operating at high frequencies in the microwave region and for the formation on compound semiconductor substrates have been developed actively.

Of the MMICs, particularly important devices are transistors, which in turn operate at very high speeds because the compound semiconductor has a high electron mobility. One of such transistors is known as a HEMT (High Electron Mobility Transistor).

A structure of a conventional HEMT will be described. An electron transit layer is formed on a compound semiconductor substrate, and an electron supply layer is formed on the electron transit layer. First to third heavily doped layers are partially formed on the electron supply layer. A first source electrode is formed on the first heavily doped layer, and a drain electrode is formed on the second heavily doped layer. A second source electrode is formed on the third heavily doped layer. A first gate electrode having an overhanging shape is formed on a portion of the electron supply layer which lies between the first heavily doped layer and the second heavily doped layer. A second gate electrode having an overhanging shape is formed on a portion of the electron supply layer which lies between the second heavily doped layer and the third heavily doped layer. A resin having a relative dielectric constant ranging from about 4 to about 5 is formed to cover the first and second gate electrodes. A metal interconnect line is formed on the resin. The metal interconnect line is connected to the first and second source electrodes through first and second contact holes formed in the resin.

A gate voltage applied to the first and second gate electrodes is used to adjust the amount of electrons supplied from the electron supply layer to the electron transit layer, thereby controlling the amount of current flowing between the source electrodes and the drain electrode.

Techniques for forming an air space around the gate electrode of a HEMT are disclosed in Japanese Patent Application Laid-Open No. 2001-118859, Japanese Patent Application Laid-Open No. 6-140440 (1994), and Japanese Patent Application Laid-Open No. 2002-299443.

In the above-mentioned HEMT structure, there are intrinsic inevitable capacitors between the first and second heavily doped layers and the first gate electrode and between the second and third heavily doped layers and the second gate electrode. In the conventional HEMT, these capacitors have relatively large parasitic capacitances because the resin having the relative dielectric constant ranging from about 4 to about 5 covers the first and second gate electrodes. As a result, the conventional HEMT presents a problem in that the parasitic capacitances result in the reduction in electrical characteristics of the device in a high frequency range.

SUMMARY OF THE INVENTION

It is an object of the present invention to provide a method of manufacturing a semiconductor device which is capable of reducing a parasitic capacitance to provide an excellent electrical characteristic in a high frequency range.

According to a first aspect of the present invention, a method of manufacturing a semiconductor device includes the following steps (a) through (f). The step (a) is to form a transistor having a structure including a first source electrode, a gate electrode, a drain electrode and a second source electrode arranged in the order named in a first direction on an upper surface of a semiconductor substrate. The step (b) is to form a first side wall and a second side wall on the upper surface of the semiconductor substrate, the first side wall and the second side wall being arranged on opposite sides of the transistor in a second direction perpendicular to the first direction. The step (c) is to form a sacrificial layer on the upper surface of the semiconductor substrate to cover the transistor. The step (d) is to partially remove the sacrificial layer to expose the first source electrode and the second source electrode. The step (e) is to form an interconnect line extending in the first direction on an upper surface of the sacrificial layer, the interconnect line being in contact with the first side wall and the second side wall, the interconnect line being connected to the first source electrode and the second source electrode, the step (e) being performed after the step (d). The step (f) is to remove the sacrificial layer, the step (f) being performed after the step (e).

The method reduces the parasitic capacitance to provide the semiconductor device exhibiting the excellent electrical characteristic in the high frequency range.

According to a second aspect of the present invention, a method of manufacturing a semiconductor device includes the following steps (a) through (f). The step (a) is to form a transistor having a structure including a first source electrode, a gate electrode, a drain electrode and a second source electrode arranged in the order named in a predetermined direction on an upper surface of a semiconductor substrate. The step (b) is to form a sacrificial layer on the upper surface of the semiconductor substrate to cover the transistor. The step (c) is to partially remove the sacrificial layer to expose the first source electrode and the second source electrode. The step (d) is to form an interconnect line extending in the predetermined direction on an upper surface of the sacrificial layer, the interconnect line being connected to the first source electrode and the second source electrode, the step (d) being performed after the step (c). The step (e) is to remove the sacrificial layer, the step (e) being performed after the step (d). The step (f) is to affix a sheet, a tape or a substrate processed into a configuration for covering the transistor and the interconnect line onto the upper surface of the semiconductor substrate to cover the transistor and the interconnect line, the step (f) being performed after the step (e).

The method reduces the parasitic capacitance to provide the semiconductor device exhibiting the excellent electrical characteristic in the high frequency range.

According to a third aspect of the present invention, a method of manufacturing a semiconductor device includes the following steps (a) through (g). The step (a) is to form a transistor having a structure including a first source electrode, a gate electrode, a drain electrode and a second source electrode arranged in the order named in a predetermined direction on an upper surface of a semiconductor substrate. The step (b) is to form a sacrificial layer on the upper surface of the semiconductor substrate to cover the transistor. The step (c) is to partially remove the sacrificial layer to expose the first source electrode and the second source electrode. The step (d) is to form an interconnect line extending in the predetermined direction on an upper surface of the sacrificial layer, the interconnect line being connected to the first source electrode and the second source electrode, the step (d) being performed after the step (c). The step (e) is to remove the sacrificial layer, the step (e) being performed after the step (d). The step (f) is to form a frame having an open upper surface on the upper surface of the semiconductor substrate to surround the transistor. The step (g) is to affix a tape onto the frame, thereby to cover the transistor and the interconnect line with the frame and the tape.

The method reduces the parasitic capacitance to provide the semiconductor device exhibiting the excellent electrical characteristic in the high frequency range.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a top plan view showing a structure of a semiconductor device according to a first preferred embodiment of the present invention;

FIG. 2 is a sectional view showing a sectional structure taken along the line II-II of FIG. 1;

FIGS. 23 and 24 are top plan views showing a structure of the semiconductor device according to a sixth preferred embodiment of the present invention;

FIGS. 27 through 29 are sectional views corresponding to FIG. 26 and showing the method of manufacturing the semiconductor device in a step-by-step manner according to the sixth preferred embodiment of the present invention;

FIGS. 30 and 31 are top plan views showing a structure of the semiconductor device according to a seventh preferred embodiment of the present invention;

FIG. 33 is a top plan view showing a structure of the semiconductor device according to an eighth preferred embodiment of the present invention; and FIG. 34 is a sectional view showing a sectional structure taken along the line XXXIV-XXXIV of FIG. 33.

DESCRIPTION OF THE PREFERRED EMBODIMENTS

First Preferred Embodiment

Figure 3:
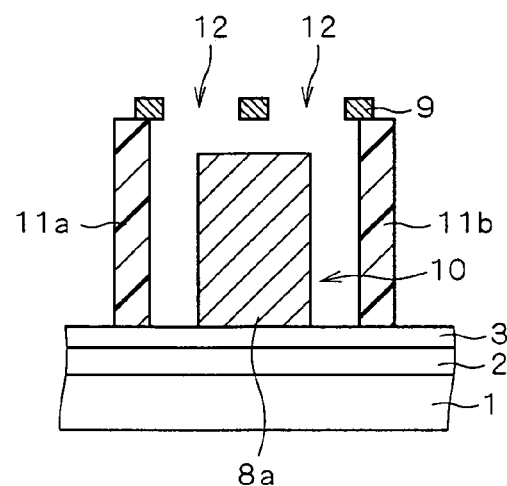
FIG. 3 is a sectional view showing a sectional structure taken along the line III-III of FIG. 1.

FIG. 1 is a top plan view showing a structure of a semiconductor device according to a first preferred embodiment of the present invention. FIGS. 2 and 3 are sectional views showing sectional structures taken along the lines II-II and III-III, respectively, of FIG. 1.

With reference to FIG. 2, a HEMT according to the first preferred embodiment includes a compound semiconductor substrate 1 such as a GaAs substrate, an electron transit layer 2, an electron supply layer 3, heavily doped layers 4a, 4b and 5, source electrodes 6a and 6b, a drain electrode 7, and gate electrodes 8a and 8b having an overhanging shape. The electron transit layer 2 is formed on the entire surface of the compound semiconductor substrate 1. The electron supply layer 3 is formed on the entire surface of the electron transit layer 2. The heavily doped layers 4a, 4b and 5 are formed partially on the electron supply layer 3 in spaced-apart relation to each other. The compound semiconductor substrate 1, the electron transit layer 2, the electron supply layer 3, and the heavily doped layers 4a, 4b and 5 are also collectively referred to hereinafter as a "semiconductor substrate."

The source electrode 6a is formed on the heavily doped layer 4a, and the source electrode 6b is formed on the heavily doped layer 4b. The drain electrode 7 is formed on the heavily doped layer 5. The gate electrode 8a is formed on a portion of the electron supply layer 3 which lies between the heavily doped layer 4a and the heavily doped layer 5. The gate electrode 8b is formed on a portion of the electron supply layer 3 which lies between the heavily doped layer 4b and the heavily doped layer 5. A metal interconnect line 9 is connected to the source electrodes 6a and 6b.

With reference to FIG. 3, side walls 11a and 11b are formed on the semiconductor substrate. The material of the side walls 11a and 11b is a photosensitive resin including polyimide-based resin, epoxy-based resin, fluorine-based polymer resin or the like. The height of the side walls 11a and 11b is greater than that of the gate electrode 8a. The metal interconnect line 9 is formed in contact with the side walls 11a and 11b. The metal interconnect line 9 is formed with slits 12 each extending therethrough from the upper surface to the bottom surface thereof.

With reference to FIGS. 2 and 3, an air space 10 is formed around the gate electrodes 8a and 8b. The air space 10 is defined by the metal interconnect line 9, the side walls 11a and 11b and the upper surface of the semiconductor substrate.

With reference to FIG. 1, the source electrode 6a, the gate electrode 8a, the drain electrode 7, the gate electrode 8b and the source electrode 6b are arranged in the order named in a horizontal direction (referred to hereinafter as a "first direction") in the plane of the figure. The side walls 11a and 11b and the metal interconnect line 9 extend in the first direction. The side walls 11a and 11b are arranged on opposite sides of the HEMT in a vertical direction (referred to hereinafter as a "second direction") in the plane of the figure. The metal interconnect line 9 is formed with a plurality of openings (six slits 12 in the instance shown in FIG. 1). The size of each of the slits 12 is, for example, as follows: 1 µm in width and 20 µm in length. Small holes having a square or circular shape may be used in place of the rectangular slits 12.

FIGS. 4 through 7 are sectional views corresponding to FIG. 2 and showing a method of manufacturing the semiconductor device in a step-by-step manner according to the first preferred embodiment of the present invention. FIGS. 8 through 12 are sectional views corresponding to FIG. 3 and showing the method of manufacturing the semiconductor device in a step-by-step manner according to the first preferred embodiment of the present invention.

Figure 4:
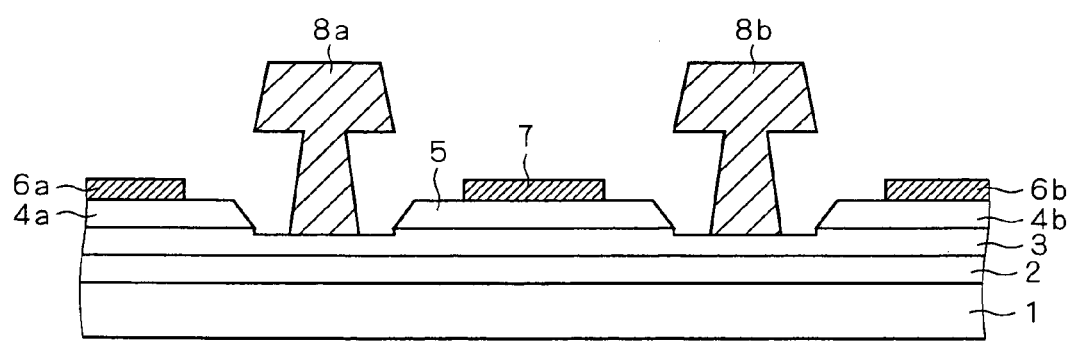
FIGS. 4 through 7 are sectional views corresponding to FIG. 2 and showing a method of manufacturing the semiconductor device in a step-by-step manner according to the first preferred embodiment of the present invention.
Figure 8:
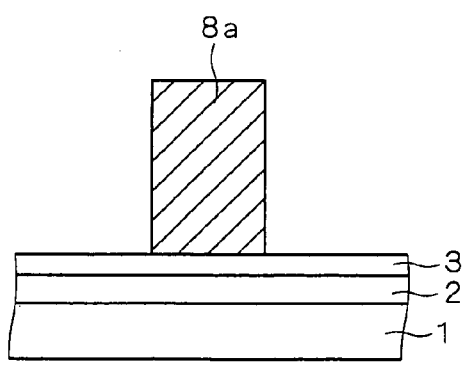
FIGS. 8 through 12 are sectional views corresponding to FIG. 3 and showing the method of manufacturing the semiconductor device in a step-by-step manner according to the first preferred embodiment of the present invention.

With reference to FIGS. 4 and 8, a known HEMT manufacturing process is initially performed to form a HEMT including the compound semiconductor substrate 1, the electron transit layer 2, the electron supply layer 3, the heavily doped layers 4a, 4b and 5, the source electrodes 6a and 6b, the drain electrode 7, and the gate electrodes 8a and 8b.

Figure 9:
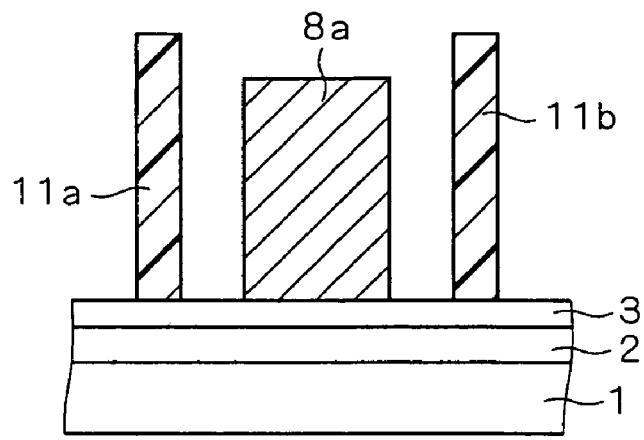

Referring to FIG. 9, a photolithographic process is used to form the side walls 11a and 11b on the semiconductor substrate.

Figure 5:
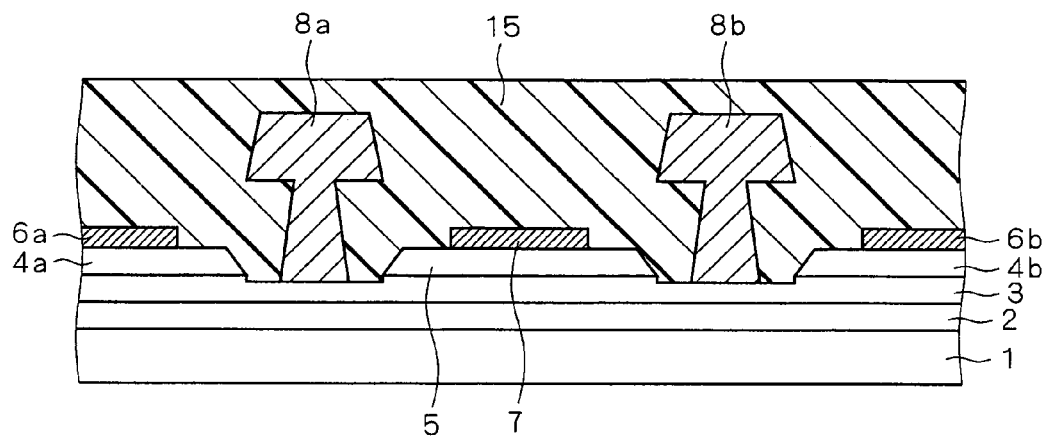
Figure 10:
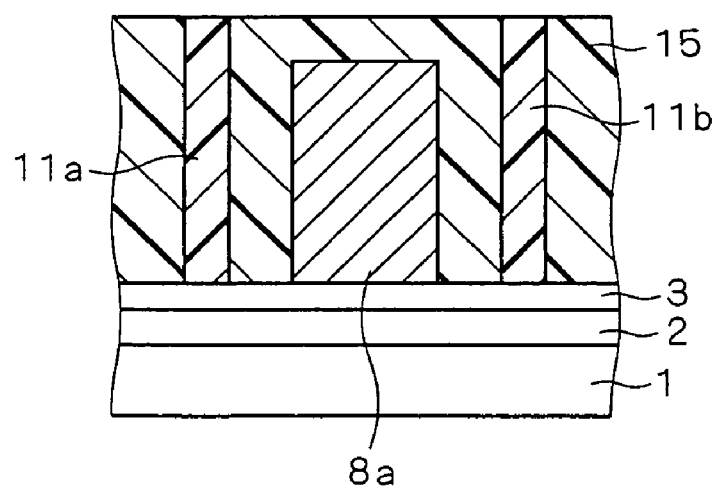

With reference to FIGS. 5 and 10, a photolithographic process is used to form a sacrificial layer 15 on a portion of the semiconductor substrate where the side walls 11a and 11b are not formed, the sacrificial layer 15 being made of a different photosensitive resin than the material of the side walls 11a and 11b. As illustrated in FIG. 5, the sacrificial layer 15 is formed to cover the HEMT.

Figure 6:
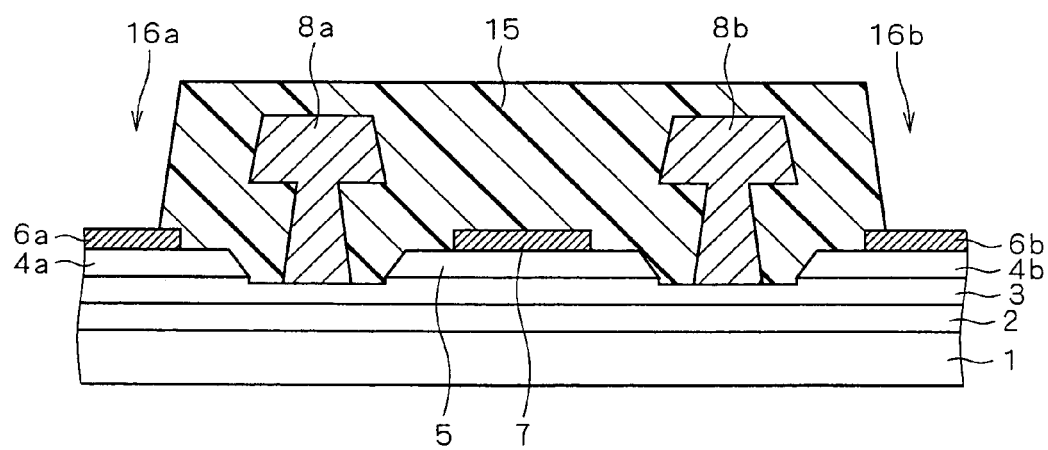

Referring to FIG. 6, a development process is performed after the sacrificial layer 15 is partially exposed to light, thereby to form contact holes 16a and 16b in the sacrificial layer 15. This provides exposed upper surfaces of the source electrodes 6a and 6b.

Figure 7:
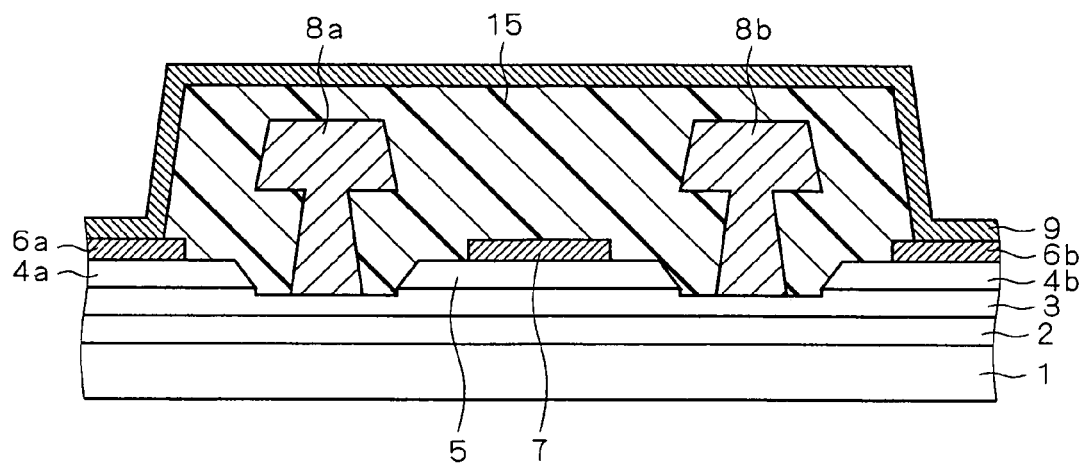
Figure 11:
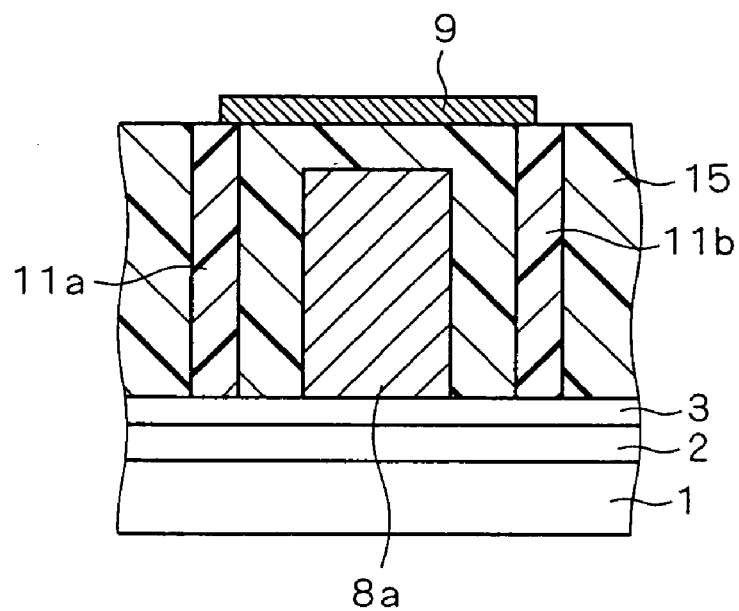

With reference to FIGS. 7 and 11, a vapor deposition process is used to form a metal film made of gold or the like on the entire surfaces of the sacrificial layer 11 and the side walls 11a and 11b. Next, the metal interconnect line 9 is formed by patterning the metal film.

Figure 12:
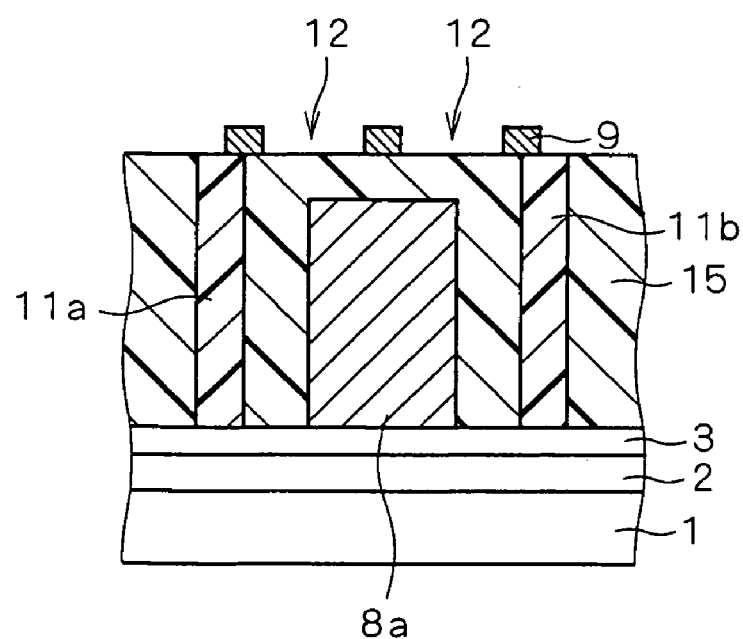

Referring to FIG. 12, a photolithographic process and an etching process are used to partially remove the metal interconnect line 9, thereby forming the slits 12. This provides a partially exposed upper surface of the sacrificial layer 15.

Thereafter, an organic amine-based solvent which does not dissolve the side walls 11a and 11b but dissolves the sacrificial layer 15 is used to dissolve the sacrificial layer 15. Next, the dissolved sacrificial layer 15 is discharged through the slits 12 to the outside. The removal of the sacrificial layer 15 results in the formation of the air space to provide the structures shown in FIGS. 2 and 3. The slits 12 are closed after the removal of the sacrificial layer 15. The method of closing the slits 12 will be described later in second to fifth preferred embodiments.

The HEMT according to the first preferred embodiment includes the air space 10 around the gate electrodes 8a and 8b, as illustrated in FIG. 2. The air space 10 has a relative dielectric constant of about 1. This reduces a parasitic capacitance formed between the gate electrodes 8a and 8b and the heavily doped layers 4a, 4b and 5 by about 70% to 80%, as compared with the conventional HEMT including the gate electrodes covered with a resin having a relative dielectric constant ranging from about 4 to about 5. Consequently, the first preferred embodiment can significantly improve the electrical characteristics of the device in the high frequency range.

Additionally, the side walls 11a and 11b are formed on the semiconductor substrate, and the upper and side surfaces of the air space 10 are completely enclosed by the metal interconnect line 9 and the side walls 11a and 11b. This avoids a sealing resin flowing into the air space 10 in a subsequent process step for sealing the semiconductor device with the resin.

Second Preferred Embodiment

Figure 13:
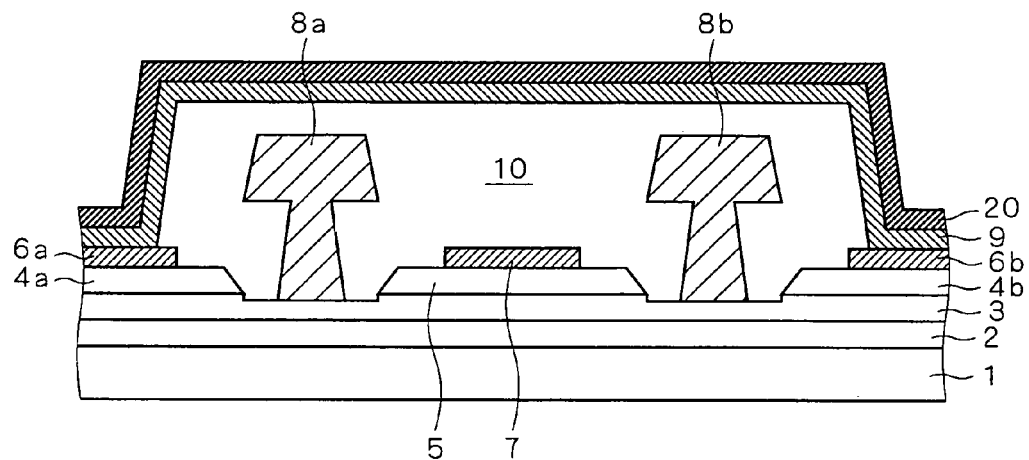
FIG. 13 is a sectional view corresponding to FIG. 2 and showing a structure of the semiconductor device according to a second preferred embodiment of the present invention.
Figure 14:
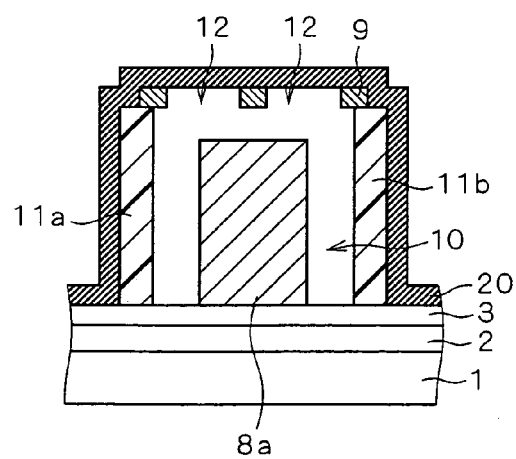
FIG. 14 is a sectional view corresponding to FIG. 3 and showing a structure of the semiconductor device according to the second preferred embodiment of the present invention.

FIGS. 13 and 14 are sectional views corresponding to FIGS. 2 and 3, respectively, and showing structures of the semiconductor device according to a second preferred embodiment of the present invention. An insulation film 20 made of $Ta_2O_5$, BST, STO or the like is formed on the metal interconnect line 9, and the slits 12 are closed by the insulation film 20.

After the structures shown in FIGS. 2 and 3 are provided, a CVD process or an evaporation process is used to deposit or evaporate the insulation film 20 on the entire surface of the metal interconnect line 9. The size of each of the slits 12 is, for example, as follows: 1 µm in width and 20 µm in length. The thickness of the insulation film 20 is, for example, 3 µm. Because of the very small width of the slits 12, the insulation film 20 being deposited or evaporated does not enter the interior of the slits 12 but is formed to span over the slits 12 in the step of forming the insulation film 20. As a result, the insulation film 20 closes the slits 12 to create the hermetically sealed air space 10.

The method of manufacturing the semiconductor device according to the second preferred embodiment diverts the CVD process or evaporation process commonly widely used as a film deposition technique for the purpose of closing the slits 12, thereby to produce the effect of facilitating the formation of the insulation film 20.

Third Preferred Embodiment

Figure 15:
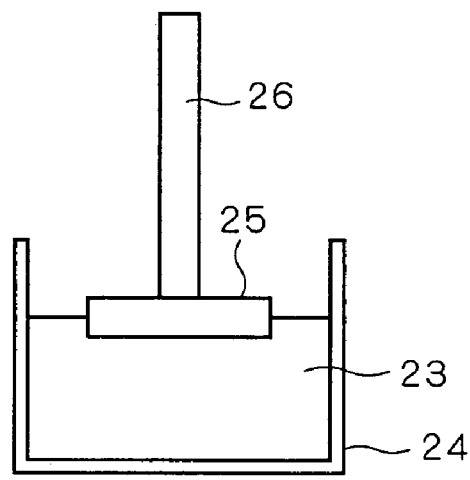
FIGS. 15 and 16 are schematic views showing the method of manufacturing the semiconductor device in a step-by-step manner according to a third preferred embodiment of the present invention.
Figure 16:
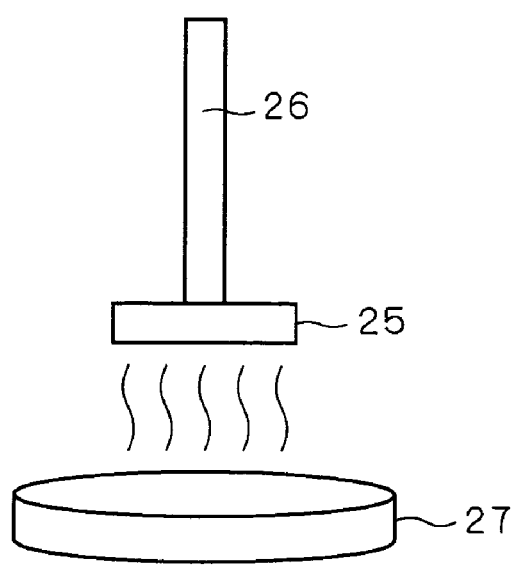

FIGS. 15 and 16 are schematic views showing the method of manufacturing the semiconductor device in a step-by-step manner according to a third preferred embodiment of the present invention.

With reference to FIG. 15, a liquid resin 23 having a high viscosity such as a polyimide or the like is stored in a liquid tank 24. A wafer 25 formed with the structures shown in FIGS. 2 and 3 is supported by a support rod 26, with the metal interconnect line 9 positioned to face downward (that is, with the structures of FIGS. 2 and 3 turned upside down). The wafer 25 in this position is dipped into the liquid resin 23. Thus, the liquid resin 23 is applied to the surface of the metal interconnect line 9. The wafer 25 may be spin-coated with the liquid resin 23, rather than being dipped into the liquid resin 23.

With reference to FIG. 16, after the wafer 25 is taken out of the liquid resin 23, the wafer 25 is opposed to a hot plate 27, with the metal interconnect line 9 positioned similarly to face downward (that is, with the surface coated with the liquid resin 23 positioned to face downward), whereby a cure bake process is performed.

Figure 17:
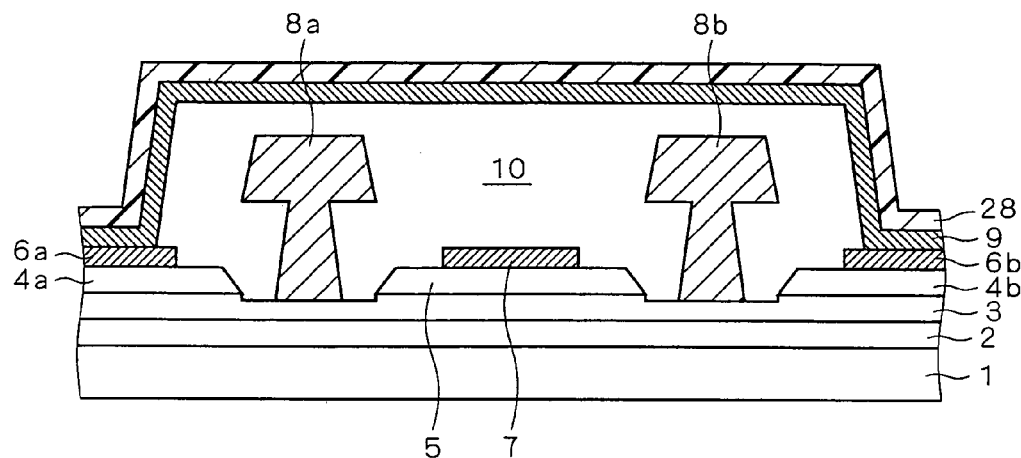
FIG. 17 is a sectional view corresponding to FIG. 2 and showing a structure of the semiconductor device according to the third preferred embodiment of the present invention.
Figure 18:
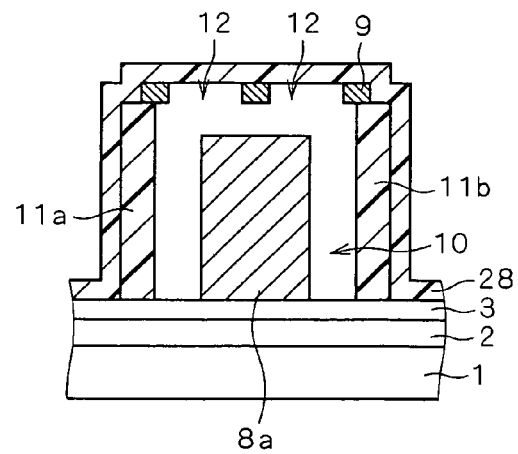
FIG. 18 is a sectional view corresponding to FIG. 3 and showing a structure of the semiconductor device according to the third preferred embodiment of the present invention.

FIGS. 17 and 18 are sectional views corresponding to FIGS. 2 and 3, respectively, and showing structures of the semiconductor device according to the third preferred embodiment of the present invention. A resin film 28 obtained by cure-baking the liquid resin 23 is formed on the metal interconnect line 9, and the slits 12 are closed by the resin film 28. Because the liquid resin 23 having a high viscosity is used, the liquid resin 23 being applied does not enter the interior of the slits 12 but is formed to span over the slits 12 in the step of forming the resin film 28. As a result, the resin film 28 closes the slits 12 to create the hermetically sealed air space 10.

The method of manufacturing the semiconductor device according to the third preferred embodiment diverts a commonly widely used coating apparatus for the purpose of closing the slits 12, thereby to produce the effect of facilitating the formation of the resin film 28.

Additionally, the method according to the third preferred embodiment need not employ a vacuum apparatus to close the slits 12. This achieves the reduction in costs as compared with the method of manufacturing the semiconductor device according to the second preferred embodiment.

Further, the execution of the cure bake process, with the surface coated with the liquid resin 23 positioned to face downward, prevents the liquid resin 23 from entering the air space 10 through the slits 12 more reliably.

Fourth Preferred Embodiment

Figure 19:
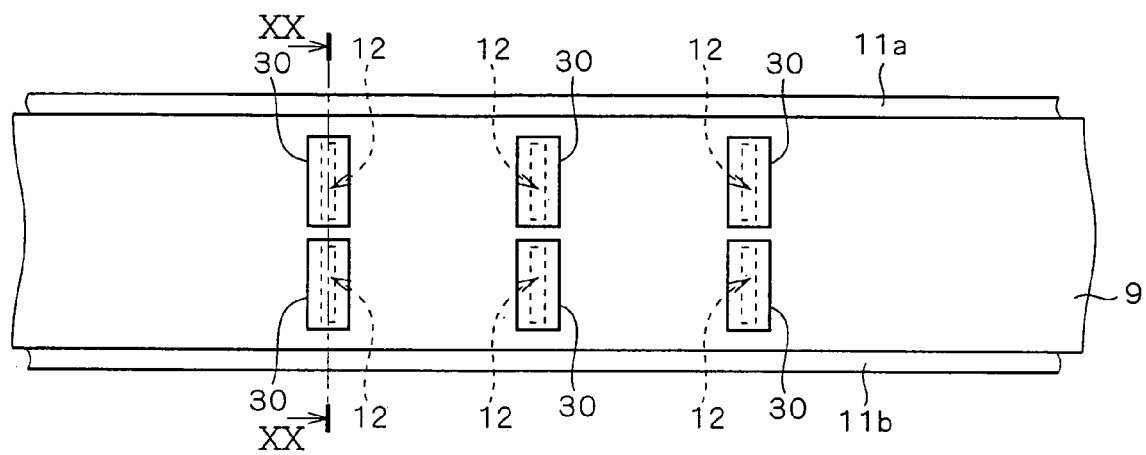
FIG. 19 is a top plan view corresponding to FIG. 1 and showing a structure of the semiconductor device according to a fourth preferred embodiment of the present invention.
Figure 20:
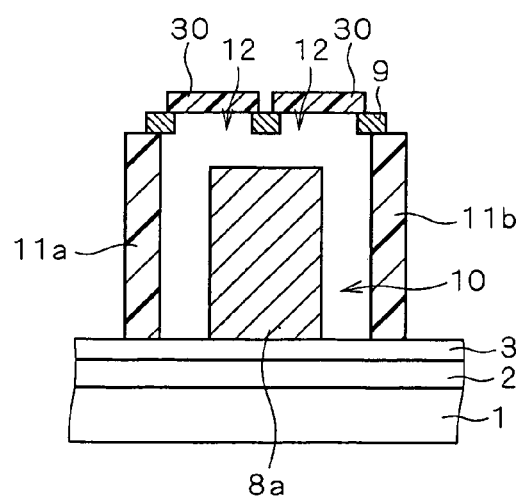
FIG. 20 is a sectional view showing a sectional structure taken along the line XX-XX of FIG. 19.

FIG. 19 is a top plan view corresponding to FIG. 1 and showing a structure of the semiconductor device according to a fourth preferred embodiment of the present invention. FIG. 20 is a sectional view showing a sectional structure taken along the line XX-XX of FIG. 19.

After the structures shown in FIGS. 1 through 3 are provided, tapes 30 made of a polymeric material capable of adhesion (e.g., polyimide, polyethylene terephthalate, carbon and the like) are attached to adhere to upper surface portions of the metal interconnect line 9 where the slits 12 are formed. As a result, the tapes 30 close the slits 12 to create the hermetically sealed air space 10.

The method of manufacturing the semiconductor device according to the fourth preferred embodiment need not employ a vacuum apparatus to close the slits 12. This achieves the reduction in costs as compared with the method of manufacturing the semiconductor device according to the second preferred embodiment.

Fifth Preferred Embodiment

Figure 21:
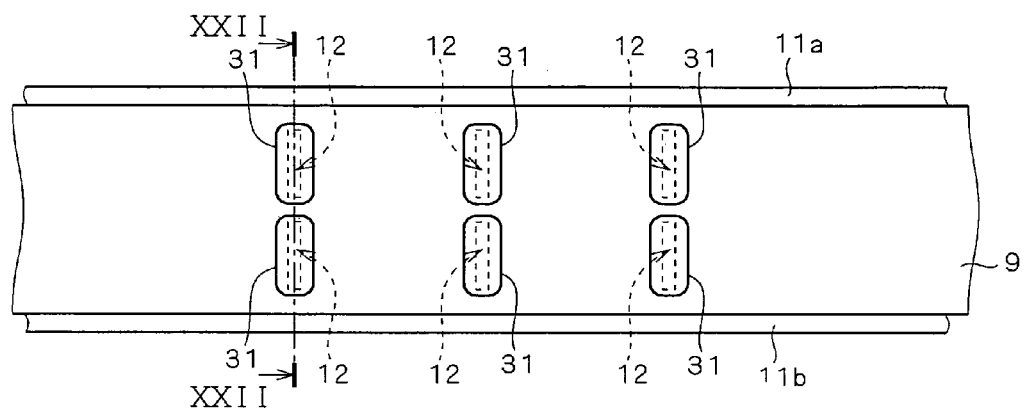
FIG. 21 is a top plan view corresponding to FIG. 1 and showing a structure of the semiconductor device according to a fifth preferred embodiment of the present invention.
Figure 22:
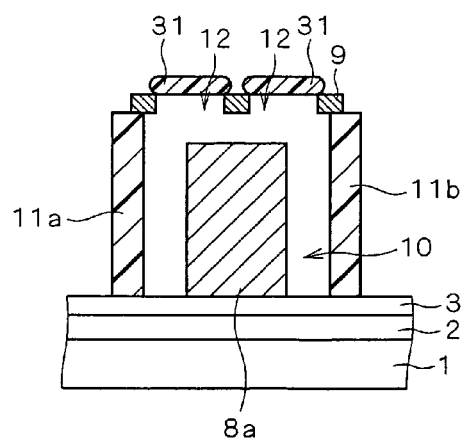
FIG. 22 is a sectional view showing a sectional structure taken along the line XXII-XXII of FIG. 21.

FIG. 21 is a top plan view corresponding to FIG. 1 and showing a structure of the semiconductor device according to a fifth preferred embodiment of the present invention. FIG. 22 is a sectional view showing a sectional structure taken along the line XXII-XXII of FIG. 21.

After the structures shown in FIGS. 1 through 3 are provided, resin ink 31 having a high viscosity such as a polyimide or the like is bonded to upper surface portions of the metal interconnect line 9 where the slits 12 are formed. Because the resin ink 31 having a high viscosity is used, the resin ink 31 does not enter the interior of the slits 12 but is formed to span over the slits 12. As a result, the resin ink 31 closes the slits 12 to create the hermetically sealed air space 10.

Typically, the step of inspecting a transistor for electrical characteristics is carried out in the process of manufacturing the transistor. A predetermined mark is placed on a transistor judged to be nonconforming as a result of the inspection by bonding resin ink to the transistor for the purpose of distinction from transistors judged to be conforming. It is desirable that the step of bonding the resin ink 31 for the purpose of closing the slits 12 be performed in conjunction with the step of bonding the resin ink onto the nonconforming transistor. This achieves the reduction in costs and shortens the total time required for the manufacture of the semiconductor device, as compared with the process in which the step of bonding the resin ink 31 for the purpose of closing the slits 12 is carried out as an independent step.

The method of manufacturing the semiconductor device according to the fifth preferred embodiment need not employ a vacuum apparatus to close the slits 12. This achieves the reduction in costs as compared with the method of manufacturing the semiconductor device according to the second preferred embodiment.

Sixth Preferred Embodiment

Figure 24:
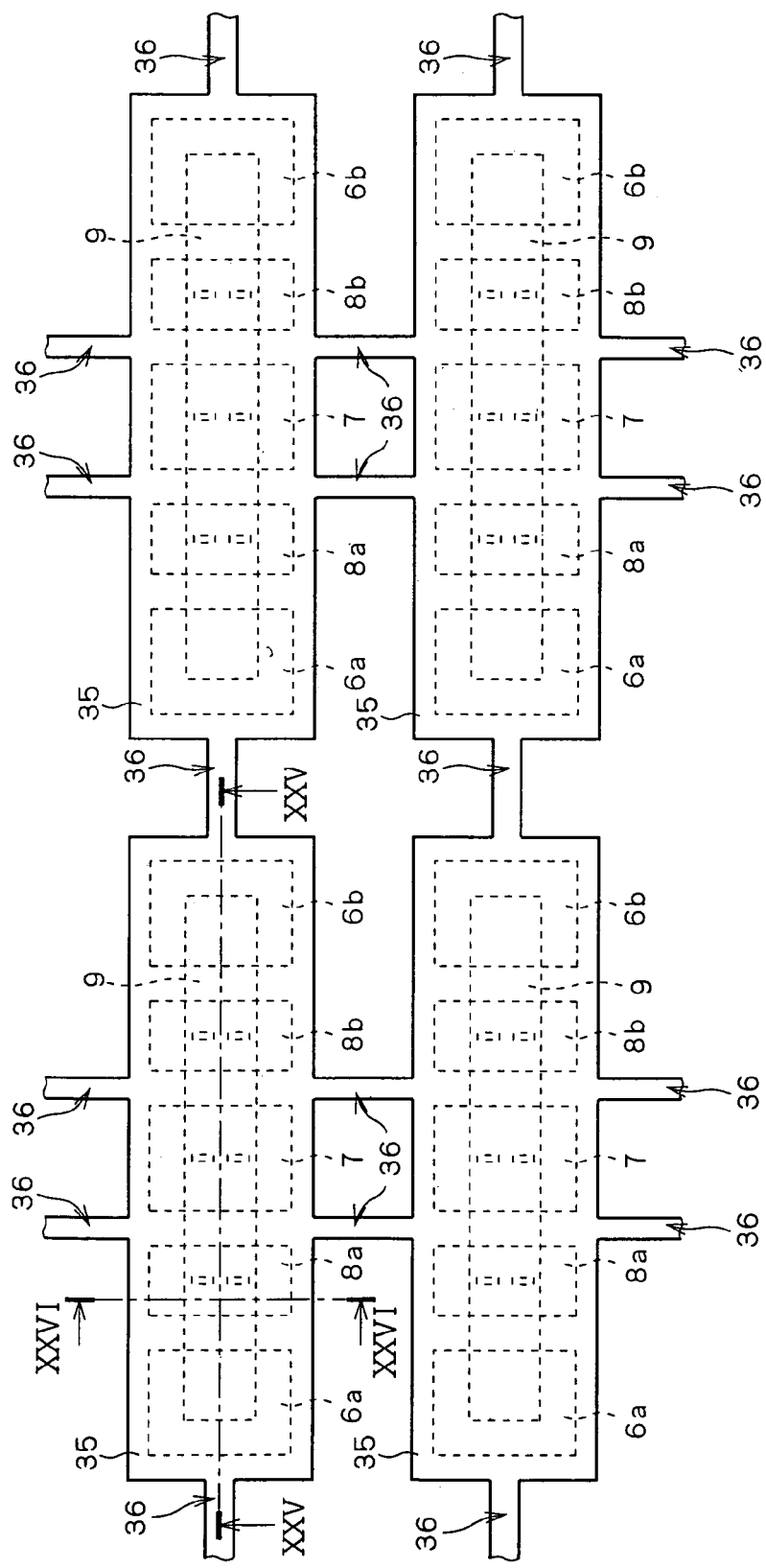
Figure 25:
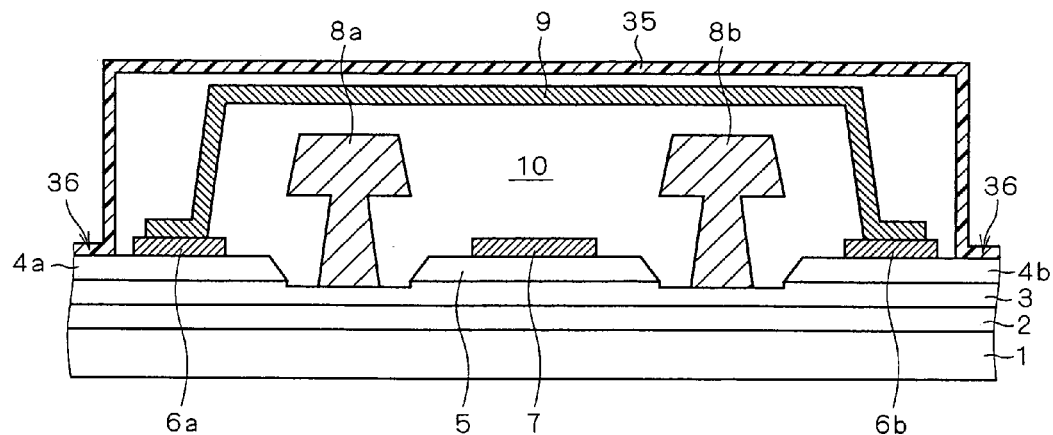
FIG. 25 is a sectional view showing a sectional structure taken along the line XXV-XXV of FIG. 24.
Figure 26:
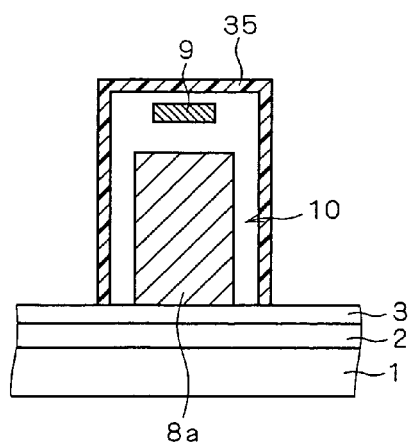
FIG. 26 is a sectional view showing a sectional structure taken along the line XXVI-XXVI of FIG. 24.

FIGS. 23 and 24 are top plan views showing a structure of the semiconductor device according to a sixth preferred embodiment of the present invention. FIGS. 25 and 26 are sectional views showing sectional structures taken along the lines XXV-XXV and XXVI-XXVI, respectively, of FIG. 24. Sheets 35 shown in FIG. 24 are not illustrated in FIG. 23.

With reference to FIG. 23, the semiconductor device according to the sixth preferred embodiment includes a plurality of HEMTs arranged in a matrix form on the same compound semiconductor substrate 1. Only four HEMTs are typically shown in FIG. 23. The structure of each of the HEMTs is similar to that of the HEMT according to the first preferred embodiment.

With reference to FIGS. 24 through 26, the semiconductor device according to the sixth preferred embodiment includes the sheets 35 processed into a configuration for covering the HEMTs and the metal interconnect lines 9. The sheets 35 are formed, for example, using a polymeric material (e.g., polyimide, polyethylene terephthalate, carbon and the like). With reference to FIG. 24, the sheets 35 for covering the HEMTs, respectively, are coupled to each other by coupling portions 36 to constitute a single sheet as a whole. With reference to FIGS. 25 and 26, the sheet 35 is affixed onto the semiconductor substrate. Covering the HEMT with the sheet 35 creates the air space 10 around the gate electrodes 8a and 8b. The air space 10 is defined by the sheet 35 and the upper surface of the semiconductor substrate.

Figure 27:
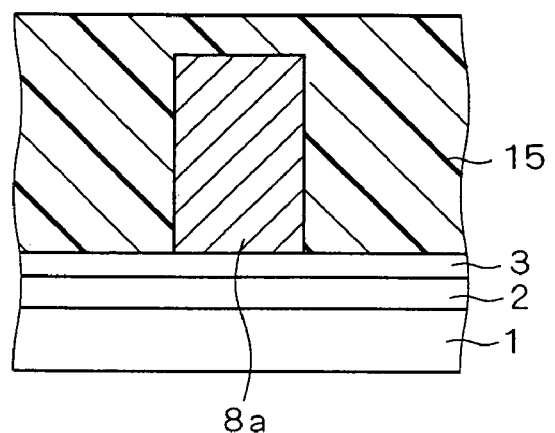
Figure 28:
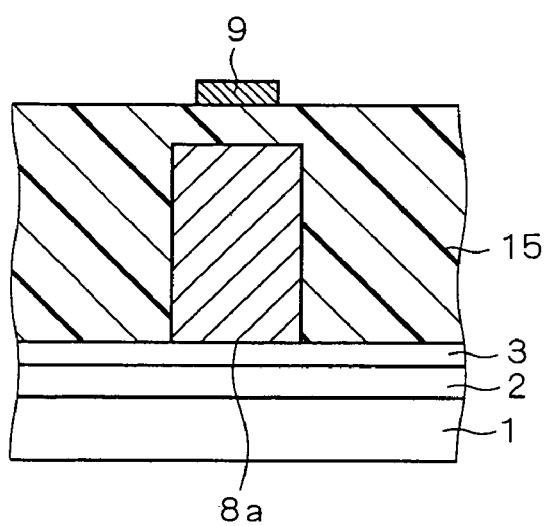

FIGS. 27 through 29 are sectional views corresponding to FIG. 26 and showing the method of manufacturing the semiconductor device in a step-by-step manner according to the sixth preferred embodiment of the present invention.

First, the structure shown in FIG. 8 is provided by a similar method to the first preferred embodiment. With reference to FIG. 27, the sacrificial layer 15 is next formed on the semiconductor substrate. The sacrificial layer 15 is formed to cover the HEMT, as illustrated in FIG. 27. Next, the contact holes 16a and 16b (not appearing in FIG. 27) are formed in the sacrificial layer 15.

With reference to FIG. 28, a metal film is formed on the sacrificial layer 15, and is then patterned to form the metal interconnect line 9. Next, the slits 12 (not appearing in FIG. 28) are formed in the metal interconnect line 9. The step of forming the slits 12 may be omitted in the sixth preferred embodiment (and also in seventh and eighth preferred embodiments to be described later).

With reference to FIG. 29, a solvent which dissolves the sacrificial layer 15 is used to dissolve the sacrificial layer 15. Thereafter, the dissolved sacrificial layer 15 is discharged to the outside.

Thereafter, the sheet 35 and the HEMT are aligned with each other, and the sheet 35 is affixed onto the semiconductor substrate to cover the HEMT and the metal interconnect line 9. This provides the structure shown in FIG. 26.

The HEMT according to the sixth preferred embodiment includes the air space 10 formed around the gate electrodes 8a and 8b, as illustrated in FIG. 25. Consequently, the sixth preferred embodiment can significantly improve the electrical characteristics of the device in the high frequency range for reasons similar to those of the first preferred embodiment.

Additionally, the sheet 35 is formed on the semiconductor substrate, and the upper and side surfaces of the air space 10 are completely enclosed by the sheet 35. This avoids a sealing resin flowing into the air space 10 in a subsequent process step for sealing the semiconductor device with the resin. To reduce the parasitic capacitance, it is sufficient that the sheet 35 is configured to surround at least the gate electrodes 8a and 8b. However, covering the entire HEMT with the sheet 35 as illustrated in FIGS. 24 through 26 enhances the effect of preventing the resin from flowing into the air space 10.

Further, the sheets 35 for covering the HEMTs, respectively, are coupled to each other by the coupling portions 36 to constitute the single sheet as a whole, as illustrated in FIG. 24. Thus, the single sheet covers the plurality of HEMTs formed on the compound semiconductor substrate 1. This achieves an improvement in throughput.

Seventh Preferred Embodiment

Figure 31:
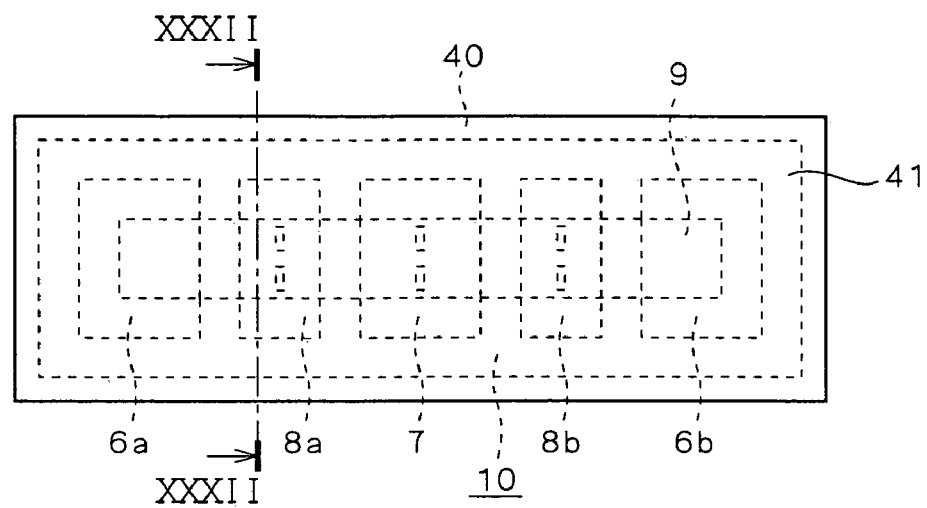
Figure 32:
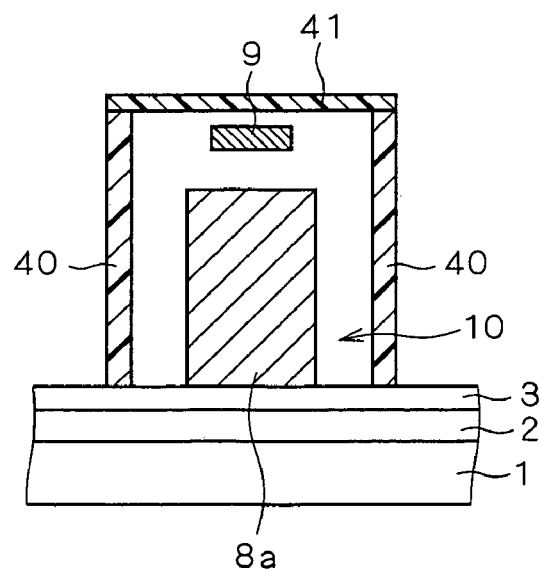
FIG. 32 is a sectional view showing a sectional structure taken along the line XXXII-XXXII of FIG. 31.

FIGS. 30 and 31 are top plan views showing a structure of the semiconductor device according to a seventh preferred embodiment of the present invention. FIG. 32 is a sectional view showing a sectional structure taken along the line XXXII-XXXII of FIG. 31. A tape 41 shown in FIG. 31 is not illustrated in FIG. 30.

With reference to FIGS. 30 through 32, the semiconductor device according to the seventh preferred embodiment includes a wall 40 in the form of a frame having an open upper surface, and the tape 41 affixed onto the wall 40 so as to close the open upper surface of the wall 40. The wall 40 is formed on the semiconductor substrate so as to surround the HEMT. The material of the wall 40 is a polyimide or the like, and the tape 41 is formed, for example, using a polymeric material. As illustrated in FIG. 32, the height of the wall 40 is greater than a distance from the upper surface of the semiconductor substrate to the upper surface of the metal interconnect line 9. The wall 40 and the tape 41 surround the HEMT to create the air space 10 around the gate electrodes 8a and 8b. The air space 10 is defined by the wall 40, the tape 41, and the upper surface of the semiconductor substrate.

After the structure shown in FIG. 29 is provided, a photolithographic process is used to form the wall 40 on the semiconductor substrate. Thereafter, the tape 41 is affixed onto the wall 40. This provides the structure shown in FIG. 32.

The HEMT according to the seventh preferred embodiment includes the air space 10 formed around the gate electrodes 8a and 8b, as illustrated in FIGS. 31 and 32. Consequently, the seventh preferred embodiment can significantly improve the electrical characteristics of the device in the high frequency range for reasons similar to those of the first preferred embodiment.

Additionally, the upper and side surfaces of the air space 10 are completely enclosed because the wall 40 is formed on the semiconductor substrate and the tape 41 is affixed onto the wall 40. This avoids a sealing resin flowing into the air space 10 in a subsequent process step for sealing the semiconductor device with the resin. This effect is enhanced in the seventh preferred embodiment in which the entire HEMT is covered with the wall 40 and the tape 41.

Eighth Preferred Embodiment

FIG. 33 is a top plan view showing a structure of the semiconductor device according to an eighth preferred embodiment of the present invention. FIG. 34 is a sectional view showing a sectional structure taken along the line XXXIV-XXXIV of FIG. 33.

The semiconductor device according to the eighth preferred embodiment includes a plurality of HEMTs arranged in a matrix form on the same compound semiconductor substrate 1 in a similar manner to FIG. 23. With reference to FIGS. 33 and 34, the semiconductor device according to the eighth preferred embodiment includes a substrate 45 having wall portions 46 processed into a configuration for covering the HEMTs and the metal interconnect lines 9. The substrate 45 is an insulating substrate or a compound semiconductor substrate such as a GaAs substrate. A tape formed of a polymeric material may be used in place of the substrate 45.

With reference to FIG. 34, the substrate 45 is affixed onto the semiconductor substrate. Covering the HEMT with the substrate 45 creates the air space 10 around the gate electrodes 8a and 8b. The air space 10 is defined by the substrate 45 and the upper surface of the semiconductor substrate.

After the structure shown in FIG. 23 is provided by a similar method to the sixth preferred embodiment, the substrate 45 is aligned so that each of the wall portions 46 is inserted between the HEMTs adjacent to each other, and is then affixed onto the semiconductor substrate. This provides the structure shown in FIGS. 33 and 34.

The HEMT according to the eighth preferred embodiment includes the air space 10 formed around the gate electrodes 8a and 8b, as illustrated in FIG. 34. Consequently, the eighth preferred embodiment can significantly improve the electrical characteristics of the device in the high frequency range for reasons similar to those of the first preferred embodiment.

Additionally, the substrate 45 (or the tape) is formed on the semiconductor substrate, and the upper and side surfaces of the air space 10 are completely enclosed by the substrate 45. This avoids a sealing resin flowing into the air space 10 in a subsequent process step for sealing the semiconductor device with the resin. This effect is enhanced in the eighth preferred embodiment in which the entire HEMTs are covered with the substrate 45.

Further, the single substrate 45 covers the plurality of HEMTs formed on the compound semiconductor substrate 1. This achieves an improvement in throughput.

While the invention has been described in detail, the foregoing description is in all aspects illustrative and not restrictive. It is understood that numerous other modifications and variations can be devised without departing from the scope of the invention.

What is claimed is:

1. A method of manufacturing a semiconductor device, comprising:
   (a) forming a transistor having a structure including a first source electrode, a gate electrode, a drain electrode, and a second source electrode, arranged in the order named in a first direction, on an upper surface of a semiconductor substrate;
   (b) forming a first side wall and a second side wall on said upper surface of said semiconductor substrate, said first side wall and said second side wall extending in the first direction, being located on opposite sides and spaced, along a second direction, that is perpendicular to the first direction and parallel to said upper surface of said semiconductor substrate, from each of said first source electrode, said gate electrode, said drain electrode, and said second source electrode, said first and second side walls having a height, perpendicular to said upper surface of said semiconductor substrate, that is higher than the height of said gate electrode with respect to said upper surface of said semiconductor substrate;
   (c) forming a sacrificial layer on said upper surface of said semiconductor substrate covering said transistor, said sacrificial layer having a height with respect to said upper surface of said semiconductor substrate substantially the same as the height of said first and second side walls;
   (d) partially removing said sacrificial layer to expose said first source electrode and said second source electrode;
   (e) forming an interconnect line extending in the first direction on an upper surface of said sacrificial layer, said interconnect line being in contact with said first side wall and said second side wall, said interconnect line being connected to said first source electrode and said second source electrode, said step (e) being performed after said step (d); and
   (f) removing said sacrificial layer, said step (f) being performed after said step (e).

2. The method according to claim 1, further comprising:
   (g) forming an opening in said interconnect line, exposing a portion of said upper surface of said sacrificial layer, said step (g) being performed between said step (e) and said step (f); and
   (h) depositing an insulating film onto said interconnect line, closing said opening, said step (h) being performed after said step (f).

3. The method according to claim 1, further comprising:
   (g) forming an opening in said interconnect line, exposing a portion of said upper surface of said sacrificial layer, said step (g) being performed between said step (e) and said step (f); and
   (h) applying a liquid resin onto said interconnect line and then baking to close said opening, said step (h) being performed after said step (f).

4. The method according to claim 3, including baking with a surface coated with said liquid resin facing downward.

5. The method according to claim 1, further comprising:
   (g) forming an opening in said interconnect line, and exposing a portion of said upper surface of said sacrificial layer, said step (g) being performed between said step (e) and said step (f); and
   (h) affixing a tape onto a portion of said interconnect line where said opening is present, closing said opening, said step (h) being performed after said step (f).

6. The method according to claim 1, thrther comprising:
   (g) forming an opening in said interconnect line, exposing a portion of said upper surface of said sacrificial layer, said step (g) being performed between said step (e) and said step (f); and
   (h) bonding resin ink onto a portion of said interconnect line where said opening is present, closing said opening, said step (h) being performed after said step (f).

7. A method of manufacturing a semiconductor device, comprising:
   (a) forming a transistor having a structure including a first source electrode, a gate electrode, a drain electrode, and a second source electrode arrangeda in the order named in a predetermined direction on an upper surface of a semiconductor substrate;
   (b) forming a sacrificial layer on said upper surface of said semiconductor substrate covering said transistor;
   (c) partially removing said sacrificial layer, exposing said first source electrode and said second source electrode;
   (d) forming an interconnect line extending in said predetermined direction on an upper surface of said sacrificial layer, said interconnect line being connected to said first source electrode and said second source electrode, said step (d) being performed after said step (c);
   (e) removing said sacrificial layer, said step (e) being performed after said step (d); and
   (f) affixing a sheet, a tape, or a substrate, which has been processed into a configuration for covering said transistor and said interconnect line, onto said upper surface of said semiconductor substrate, covering said transistor and said interconnect line and leaving an air gap between a lower surface of said sheet, tape, or substrate, which is closest to said u er surface of said semiconductor substrate, and said interconnect line, said step (f) being performed after said step (e).

8. A method of manufacturing a semiconductor device, comprising:
   (a) forming a transistor having a structure including a first source electrode, a gate electrode, a drain electrode, and a second source electrode arranged in the order named in a predetermined direction on an upper surface of a semiconductor substrate;
   (b) forming a sacrificial layer on said upper surface of said semiconductor substrate, covering said transistor;
   (c) partially removing the sacrificial layer, exposing said first source electrode and said second source electrode;
   (d) forming an interconnect line extending in said predetermined direction on an upper surface of said sacrificial layer, said interconnect line being connected to said first source electrode and said second source electrode, said step (d) being performed after said step (c);
   (e) removing said sacrificial layer, said step (e) being performed after said step (d);
   (f) forming a frame having an open upper surface on said upper surface of said semiconductor substrate, surrounding said transistor; and
   (g) affixing a tape onto said frame, covering said transistor and said interconnect line with said frame and said tape.

* * * * *